(12) United States Patent
Lee et al.

(10) Patent No.: US 8,410,746 B2
(45) Date of Patent: Apr. 2, 2013

(54) INVERTER CIRCUIT FOR VEHICLES

(75) Inventors: Jeong Yun Lee, Gyeonggi-do (KR); Sung Kyu Kim, Gyeonggi-do (KR); Jae Won Lee, Gyeonggi-do (KR); Tae Hwan Chung, Incheon (KR); Ki Young Jang, Gyeonggi-do (KR); Jung Hong Joo, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 763 days.

(21) Appl. No.: 12/579,758

(22) Filed: Oct. 15, 2009

(65) Prior Publication Data
US 2010/0089670 A1  Apr. 15, 2010

(30) Foreign Application Priority Data

Oct. 15, 2008  (KR) .......................... 10-2008-101177

(51) Int. Cl.
*H02P 27/04* (2006.01)
(52) U.S. Cl. ........................................ 318/801; 318/802
(58) Field of Classification Search .................. 318/727, 318/798, 801, 802
See application file for complete search history.

(56) References Cited

U.S. PATENT DOCUMENTS

| 4,384,287 | A | 5/1983 | Sakuma |
| 5,784,236 | A * | 7/1998 | Tardiff et al. .................. 361/56 |
| 5,920,224 | A | 7/1999 | Preslar |
| 5,946,178 | A | 8/1999 | Bijlenga |
| 5,970,964 | A * | 10/1999 | Furuhata et al. .............. 123/644 |
| 6,169,672 | B1 * | 1/2001 | Kimura et al. ............. 363/56.05 |
| 6,208,123 | B1 | 3/2001 | Sudo |
| 6,906,404 | B2 * | 6/2005 | Maly et al. ..................... 257/678 |
| 7,176,744 | B2 * | 2/2007 | Goudo .......................... 327/434 |
| 7,365,584 | B2 | 4/2008 | Bennett et al. |
| 7,453,240 | B2 * | 11/2008 | Yamauchi et al. .............. 322/12 |
| 2006/0006851 | A1 | 1/2006 | Thiery |

FOREIGN PATENT DOCUMENTS

| EP | 00902537 A2 | 3/1999 |
| JP | 07297358 A | 11/1995 |
| JP | 10127094 A | 5/1998 |
| JP | 11-055937 A | 2/1999 |
| JP | 11-261064 A | 9/1999 |
| JP | 2001-245466 A | 9/2001 |
| JP | 2002135097 A | 5/2002 |
| KR | 10-2000-0077143 | 12/2000 |

* cited by examiner

*Primary Examiner* — Rina Duda
(74) *Attorney, Agent, or Firm* — Edwards Wildman Palmer LLP; Peter F. Corless (57) ABSTRACT

The present invention provides an inverter circuit for a vehicle, which includes: a switching unit that includes a plurality of switching elements and switches a direct current into an alternating current; and a variable clamping unit that clamps an overshoot in case the overshoot is generated, and stops the operation of the switching unit in case a system voltage is greater than a clamping breakdown voltage. The circuit enables a voltage (DC input voltage) greater than a breakdown voltage of clamping unit to be used as a system voltage.

9 Claims, 8 Drawing Sheets

INVERTER CIRCUIT FOR VEHICLES

CROSS-REFERENCE TO RELATED APPLICATION

This application is based on and claims priority from Korean Patent Application No. 10-2008-101177, filed on Oct. 15, 2008, the disclosure of which is incorporated herein in its entirety by reference.

TECHNICAL FIELD

The present invention relates to an inverter circuit for a vehicle that can apply a system voltage (DC input voltage) over a maximum tolerable pressure of a clamping unit to thereby increase productivity and decrease manufacturing costs, and a vehicle including the same.

BACKGROUND ART

Figure 1A:
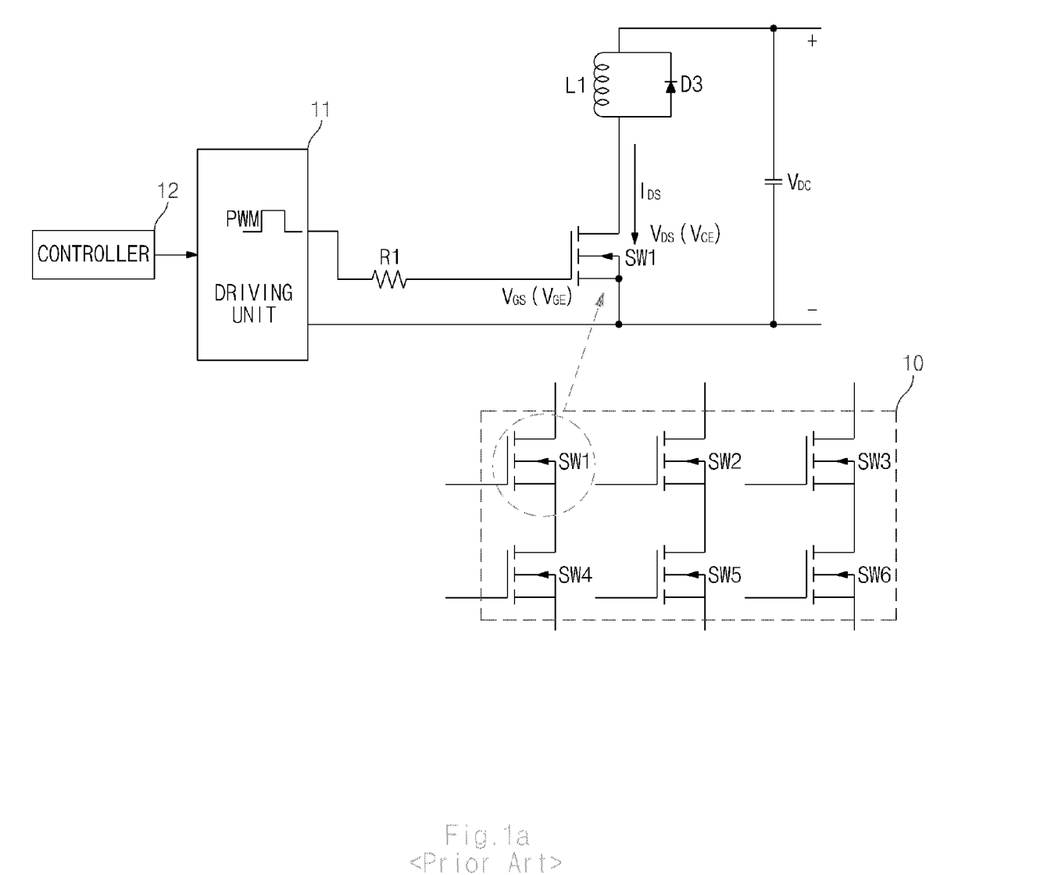
FIG. 1a is a general inverter circuit diagram.

In a hybrid vehicle, an inverter plays the role of converting high voltage DC power into AC power to operate a motor. This inverter includes an IGBT (Insulated Gate Bipolar Transistor) module (or, FET module). The IGBT module, as shown in FIG. 1a, includes a plurality of switching elements SW1~SW6 and each of the switching elements SW1~SW6 is operated by a PWM signal outputted from a driving unit 11. The PWM signal output is controlled by a controller 12.

However, an inverter three-phase output can be short circuited as a result of vehicle accident, aging of the cable, and errors in the assembling process, thereby causing a state in which an excess current flows into the IGBT module 10. If such excess state is caused, the controller 12 stops the switching of the switching elements SW1~SW6 so as to prevent the damage of the IGBT module 10.

However, in case where the switching of the switching elements SW1~SW6 is suddenly stopped, an overvoltage is instantaneously caused between the both ends (drain and source or collector and emitter) of the switching elements SW1~SW6 such that the IGBT module 10 is damaged.

Figure 1B:
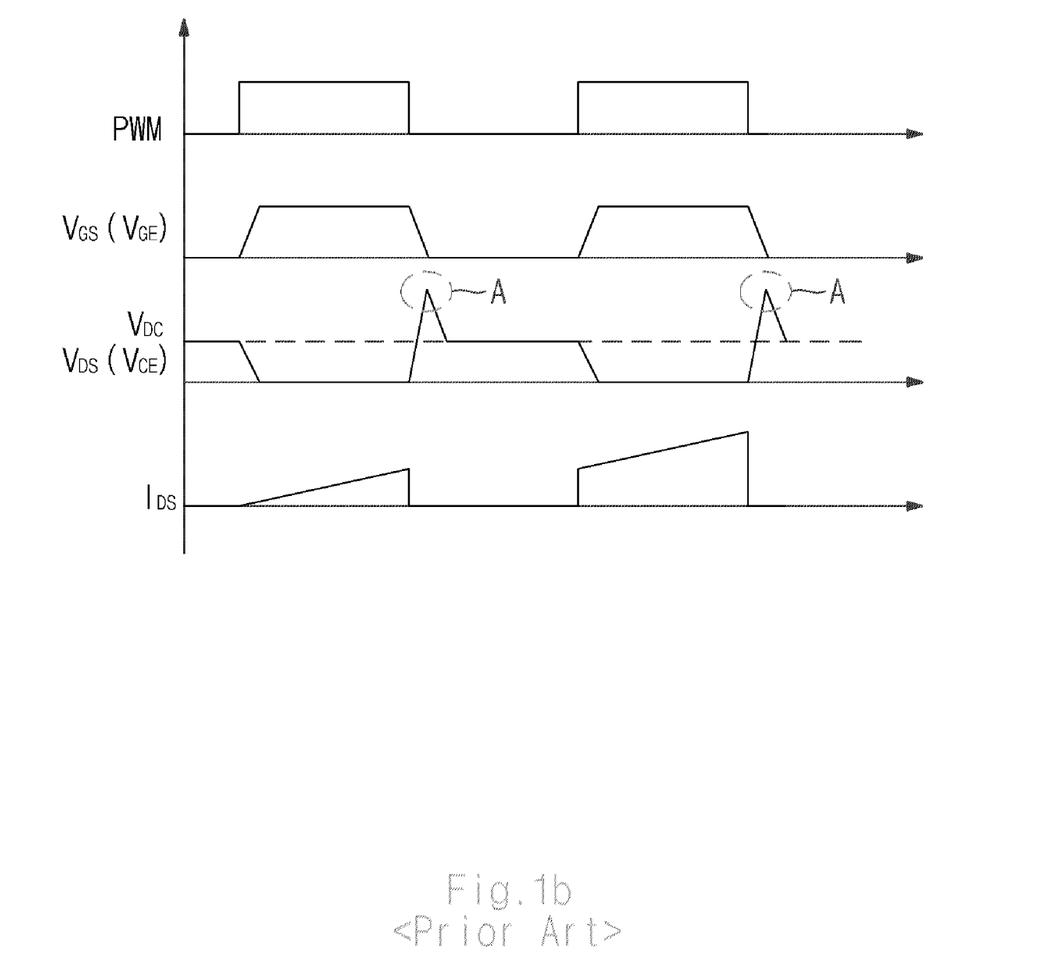

When a circuit is instantaneously short circuited or an overvoltage is generated during the operation of the IGBT module 10 as described above, an overshoot (A) that the voltage $V_{DS}$ applied to the drain end and source end of the switching element SW1 of the IGBT module 10 is instantaneously increased to a value higher than the breakdown voltage of the IGBT module 10 is caused, as shown in the timing diagram of FIG. 1b. The overshoot can damage the IGBT module 10.

Figure 2A:
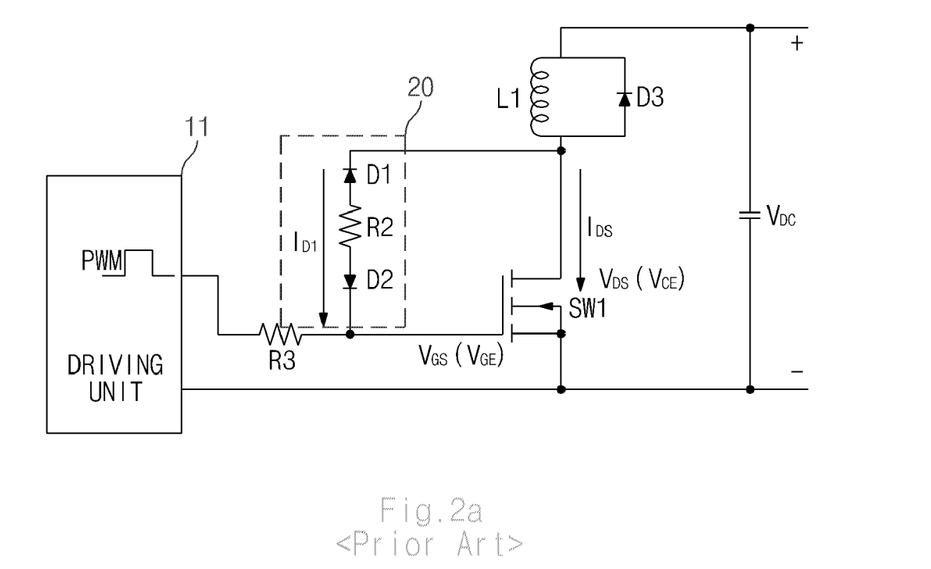
FIG. 2a is a general inverter circuit diagram including a clamping diode.

To prevent such damage, as shown in FIG. 2a, a clamping unit 20 is inserted between the drain end or collector end and the gate end of the switching element SW1, so that the overvoltage can be lowered by the clamping unit 20.

Figure 2B:
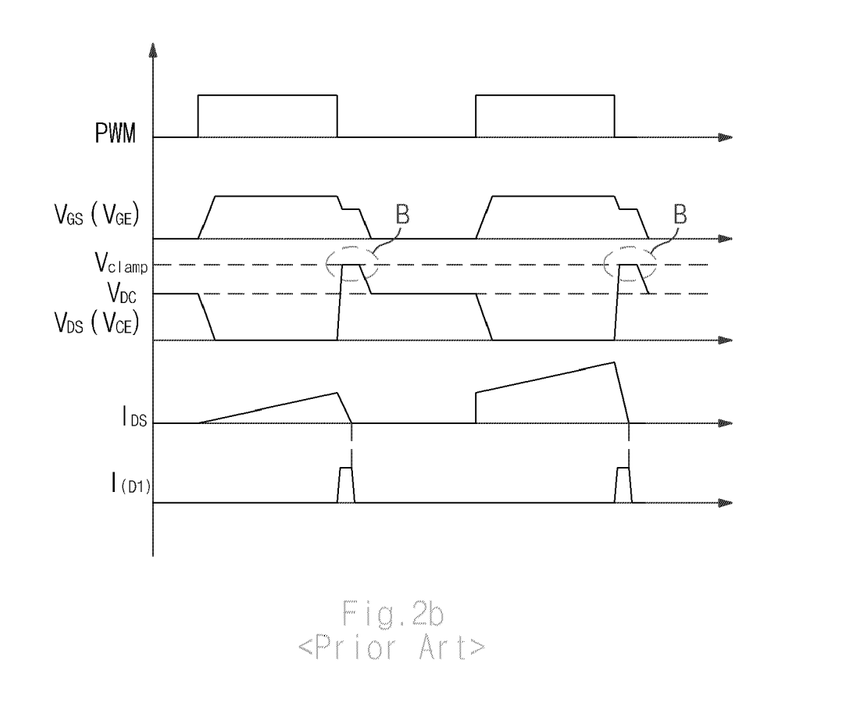
Figure 2C:
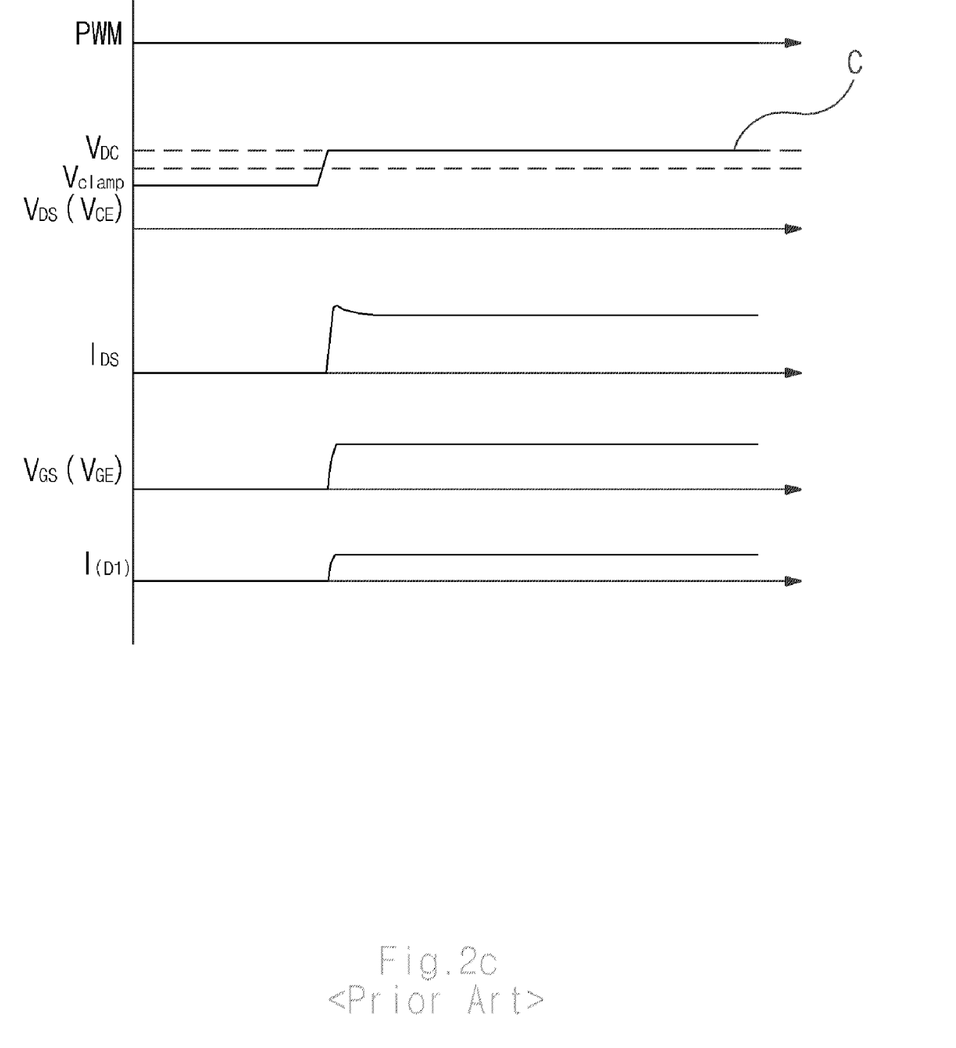

The clamping unit 20 includes a clamping diode D1, a reverse-current prevention diode D2 and a resistance R1. If the breakdown voltage of the clamping diode D1 is set to be lower than the breakdown voltage of the IGBT module 10, and the $V_{DS}$ voltage is increased to a value higher than the breakdown voltage of the clamping diode D1, the clamping diode D1 is turned on, which makes current $I_{D1}$ flow through the clamping unit 20 so that the switching element SW1 of the IGBT module 10 is turned on. As a result, the $V_{DS}$ voltage is decreased, thereby clamping, as shown in FIG. 2b, the overshoot voltage (B).

Nonetheless, if a voltage greater than the breakdown voltage of clamping unit 20 is continuously applied as the system voltage (DC input voltage) to the IGBT module 10, the switching element SW1 is continuously turned on by the clamping unit 20 and may be overheated.

That is, if it fails to control the inverter while a motor rotates at a high speed, counter electro-motive force of the motor is applied to the IGBT module 10, which then causes the system voltage $V_{DC}$ applied to the IGBT module 10 to be higher than the breakdown voltage $V_{clamp}$ of the clamping unit 20. Accordingly, the clamping diode D1 is turned on and the switching element SW1 of the IGBT module 10 is continuously turned on. As a result, excess current flows through the IGBT module 10 and the IGBT module 10 may be damaged by overheating.

As described above, if the breakdown voltage of the clamping diode is set to be lower than the system voltage such that the system voltage is increased to a value higher than the breakdown voltage of the clamping diode D1, the IGBT module may be damaged.

One approach to solve this problem was to increase the breakdown voltage of the IGBT module and the breakdown voltage of the clamping diode so as to increase the system voltage. However, increasing both the breakdown voltage of the IGBT module and the breakdown voltage of the clamping diode caused the price of the IGBT module to be increased.

For these reasons, it is difficult to achieve a maximum performance of a vehicle motor. Moreover, it is difficult to use an IGBT module having a certain breakdown voltage commonly for various vehicles since different vehicles require different the system voltages (DC input voltages).

The above information disclosed in this the Background Art section is only for enhancement of understanding of the background of the invention and therefore it may contain information that does not form the prior art that is already known in this country to a person of ordinary skill in the art.

SUMMARY

The present invention provides an inverter circuit for vehicles that can prevent such IGBT module damage.

An inverter circuit in accordance with an aspect of the present invention includes: a switching unit that includes a plurality of switching elements and switches a direct current into an alternating current; and a variable clamping unit that clamps an overshoot in case the overshoot is generated, and stops the operation of the switching unit in case a system voltage is greater than a clamping breakdown voltage.

Preferably, the variable clamping unit includes: a clamping unit that turns the switching element on to clamp the overshoot; and a variable admittance that turns the plurality of switching elements off after a given time is elapsed in case the system voltage is greater than the clamping breakdown voltage. Preferably, the variable admittance includes: a capacitor that is charged by current which flows from the clamping unit; a resistance that is connected in parallel with the capacitor. Preferably, the variable admittance turns the plurality of switching elements off when the charge of capacitor is completed. Preferably, the clamping unit includes a clamping diode that is turned on in case the overshoot is generated or the system voltage is higher than the clamping breakdown voltage to be applied. Preferably, the clamping unit further includes a reverse-current prevention diode which prevents current that flows reversely from the variable admittance to the clamping diode. Preferably, the clamping diode is a Zener diode. Preferably, the variable admittance is charged by the clamping unit, and turns the plurality of switching elements on during the charging. Preferably, the switching unit is an IGBT (Insulated Gate Bipolar Transistor) module or a FET (field-effect transistor) module.

In accordance with another aspect of the present invention, a vehicle includes: a switching unit that includes a plurality of switching elements and switches a direct current into an alternating current; a variable clamping unit that clamps an overshoot in case the overshoot is generated; and a motor unit that is operated by an output of the switching unit, wherein the variable clamping unit stops the operation of the switching unit in case a system voltage is greater than a clamping breakdown voltage due to counter electro-motive force of the motor unit.

Preferably, the variable clamping unit includes: a clamping unit that turns the plurality of switching elements on to clamp the overshoot; and a variable admittance that turns the plurality of switching elements off after a given time is elapsed in case the system voltage is greater than the clamping breakdown voltage. Preferably, the variable admittance turns the plurality of switching elements off when the charge of capacitor is completed in case the system voltage is greater than the clamping breakdown voltage due to counter electro-motive force of the motor unit.

As described above, the present invention is able to enhance the efficiency of inverter and motor and the rated power density by using the system voltage (DC input voltage) which is greater than the breakdown voltage of clamping unit such that not only the performance improvement but also the cost down and design change can be facilitated and the motor performance of vehicle can be improved.

Moreover, the present invention can increase and use the system voltage (DC input voltage) without the change of the IGBT module or the need of additional element such that it can enhance the efficiency of inverter and also the inverter maximum rating. Accordingly, the inverter can be miniaturized and the weight and volume can be reduced. Moreover, the present invention can use the IGBT module in common regardless of the car model, thereby, being able to reduce the cost of mass production.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The above and other features and advantages of the present invention will be apparent from or are set forth in more detail in the accompanying drawings, which are incorporated in and form a part of this specification, and the following Detailed Description, which together serve to explain by way of example the principles of the present invention.

BRIEF DESCRIPTION OF THE DRAWINGS

The above and other features of the present invention will now be described in detail with reference to certain exemplary embodiments thereof illustrated by the accompanying drawings which are given hereinafter by way of illustration only, and thus are not limitative of the present invention, and wherein:

FIG. 1b is a timing diagram of the general inverter circuit of FIG. 1a;

FIGS. 2b and 2c are timing diagrams of the general inverter circuit of FIG. 2a;

FIGS. 3b and 3c are a timing diagram of the inverter circuit of FIG. 3a; and

FIGS. 4a and 4b are drawings for illustrating the operation of variable admittance of FIG. 3a.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

DETAILED DESCRIPTION OF EMBODIMENTS

Figure 3A:
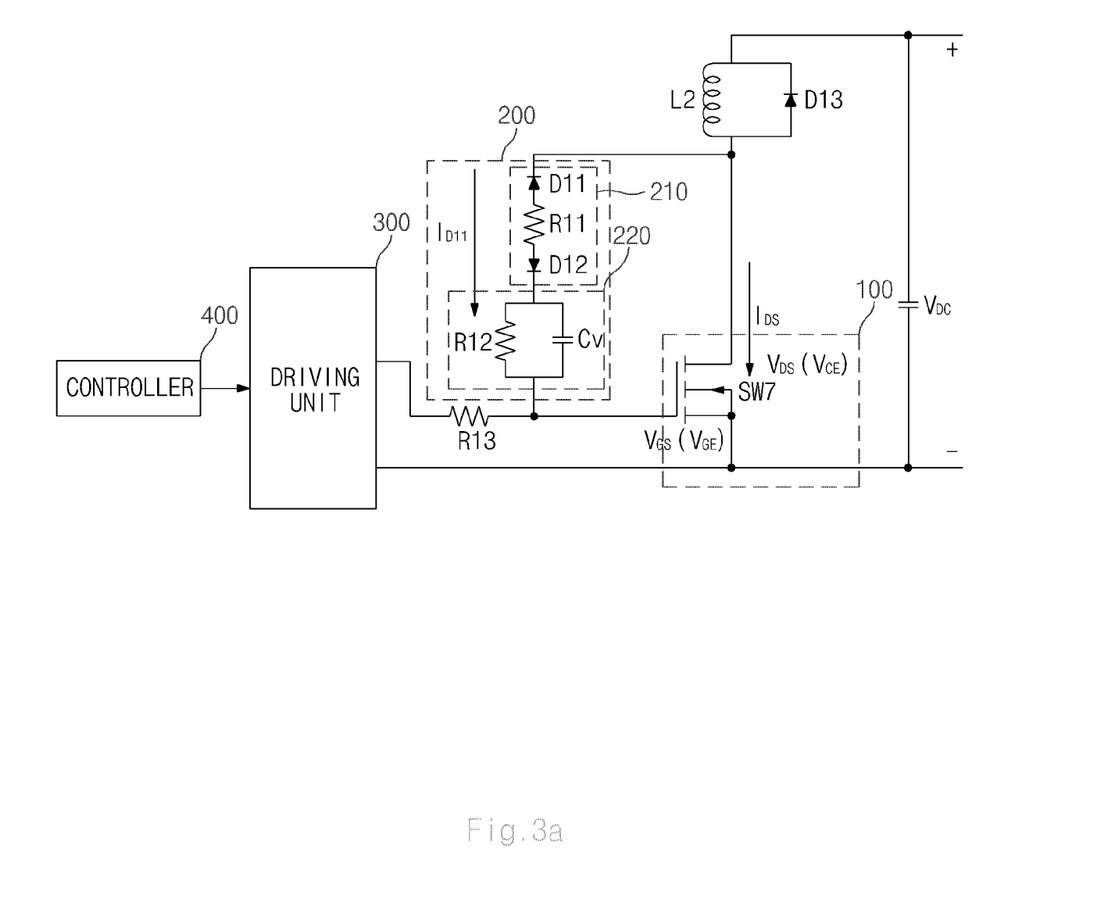
FIG. 3a is a configuration diagram of an inverter circuit according to an embodiment of the present invention.

Hereinafter, exemplary embodiments of the present invention will be described in detail with reference to the attached drawings FIG. 3a is a configuration diagram of an inverter circuit according to an embodiment of the present invention.

The inverter circuit according to the embodiment of the present invention includes an IGBT switching unit 100, a variable clamping unit 200, a driving unit 300, a controller 400, an inductor L2, a diode D13 and a resistance R13.

The IGBT switching unit 100 includes a switching element SW7. As shown in FIG. 1a, the IGBT module according to the embodiment includes a plurality of switching elements. The variable clamping unit 200 is equipped in both ends of each of the switching elements. The driving unit 300 outputs a PWM signal for operating the IGBT switching unit 100 under the control of the controller 400. The controller 400 controls the driving unit 300 to control the on/off of the IGBT switching unit 100.

In case the voltage $V_{DS}$ is increased to a value higher than the breakdown voltage $V_{clamp}$ of variable clamping diode as the switching element SW7 is abruptly turned off in the excess state, the variable clamping unit 200 turns the switching element SW7 on to prevent the overshoot. On the other hand, in case the system voltage caused by the motor counter electro-motive force is increased to a value greater than the clamping breakdown voltage, the variable clamping unit 200 turns the switching element SW7 off to prevent the damage of the IGBT module. For this, the variable clamping unit 200 includes a clamping unit 210 and a variable admittance 220.

In case the voltage $V_{DS}$ is greater than the breakdown voltage of clamping diode D11, the clamping unit 210 turns the switching element SW7 on to prevent the overshoot. For this, the clamping unit 210 includes a clamping diode D11, a reverse-current prevention diode D12 and a resistance R11 which are serially connected to one side of the drain end (collector) of the switching element SW7 and the variable admittance 220.

Here, the clamping diode D11 is turned off in case the inverter circuit normally operates, while being turned on in the excess state where the short circuit or the excess current is generated to turn the switching element SW7 on. The reverse-current prevention diode D12 prevents the reverse current from the variable admittance 220.

In case the overshoot is generated like a high pass filter, the variable admittance 220 turns the switching element SW7 on. In case the charge of capacitor Cv is completed and the capacitor Cv becomes an open state, the variable admittance 220 turns the switching element SW7 off to prevent the damage of the switching element SW7 For this, the variable admittance 220 includes an equivalent circuit in which the resistance R12 and the capacitor Cv are parallelly connected.

The capacitor Cv is charged by current $I_{D11}$ which flows from the clamping unit 210, while the resistance R12 plays the role of discharging the electric charge charged in $C_V$ by a low frequency component. Preferably, the resistance R12 may be set as 10 kΩ and the capacitor Cv is set as 10 nF in case the inverter switching frequency is 10 kHz.

Figure 3B:
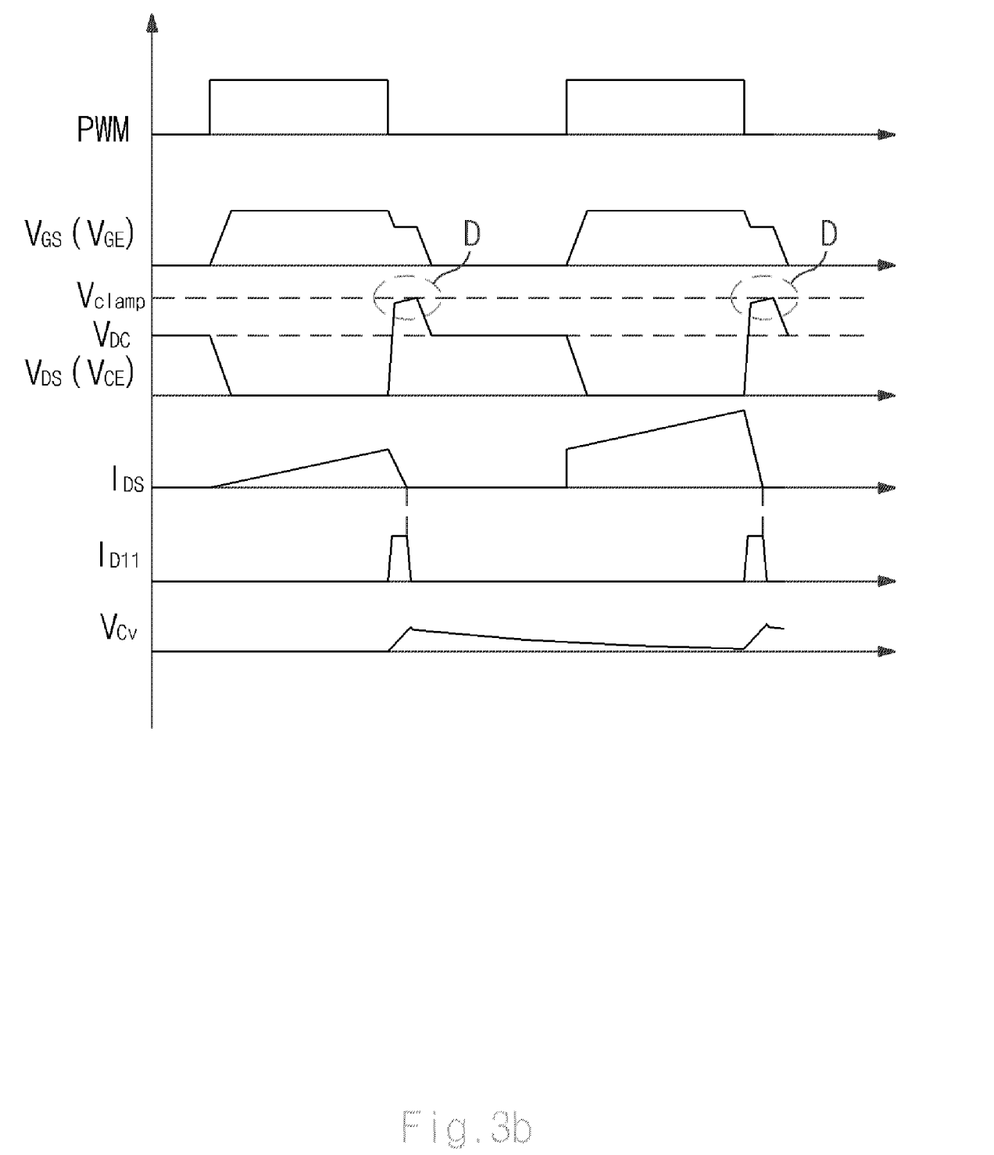

Hereinafter, the operation of the inverter circuit according to the embodiment of the present invention is illustrated in detail with reference to FIG. 3b and FIG. 3c.

Firstly, in the steady-state, the switching element SW7 is operated by the PWM signal outputted from the driving unit 300 such that the IGBT module is operated. As shown in FIG. 3b, if the PWM signal outputted from the driving unit 300 becomes a high level, the $V_{GS}$ voltage applied to the gate end and source end of the switching element SW7 becomes a high level such that the switching element SW7 is turned on. Thus, the $V_{DS}$ voltage applied to the drain end and source end of the switching element SW7 is dropped such that current $I_{DS}$ can flow.

At this time, the variable clamping unit 200 does not operate, and the clamping diode D11 is turned off.

Here, if the system voltage (DC input voltage) is lower than the breakdown voltage of clamping diode while the $V_{DS}$ voltage is lower than a given voltage as the short circuit or the excess current is not generated, the controller 400 determines that it is in steady-state and controls the driving unit 300 to output the PWM signal.

Thereafter, in case the excess state where both ends of the IGBT module is short circuited and the excess current flow is generated, the controller 400 abruptly turns the switching element SW7 off so as to protect the IGBT module. If the overshoot of the $V_{DS}$ voltage is generated due to the abrupt turn off operation of the switching element SW7, the clamping diode D11 is turned on due to the overshoot voltage. As a result, current $I_{D11}$ flows while the capacitor voltage Vcv is decreased after increasing during a period in which current ID11 flows.

Figure 4A:
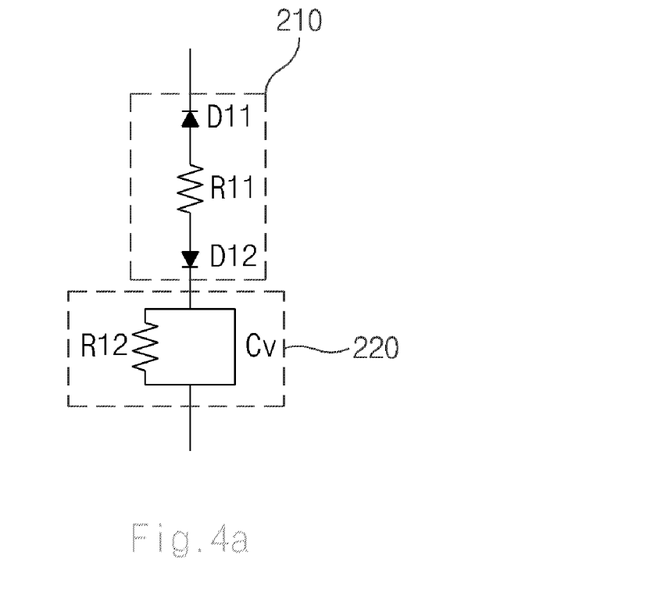
Figure 4B:
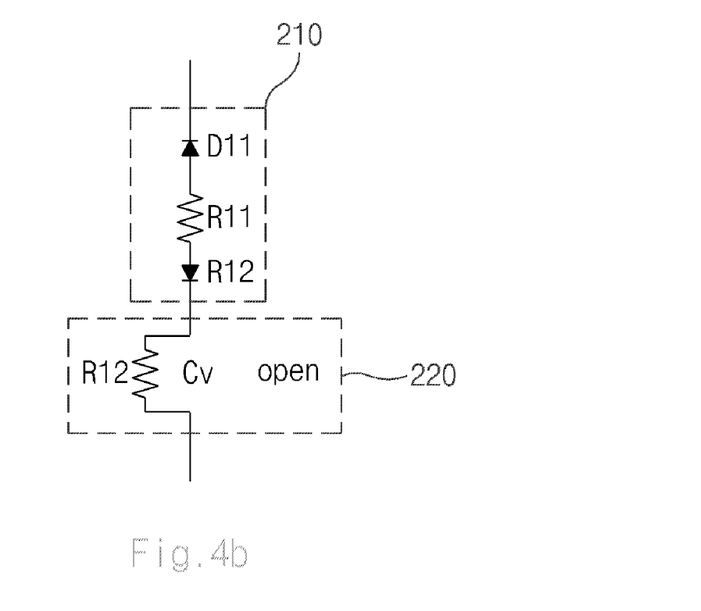

Accordingly, current flows through the clamping unit 210 and the electric charge, as shown in FIG. 4a, is charged in the capacitor Cv and the voltage of the gate end of the switching element SW7 is increased by a value obtained by multiplying current $I_{D11}$ flowing through the clamping unit 210 by the resistance R13 such that the switching element SW7 is turned on. Thus, current $I_{DS}$ flows and the $V_{DS}$ voltage applied to the drain end and source end of the switching element SW7 is decreased. As a result, as shown in FIG. 3b, the overshoot in which the $V_{DS}$ voltage is higher than the system voltage $V_{DC}$ is clamped (D) such that the damage of the switching element SW7 can be prevented. Thereafter, if the charge of capacitor Cv is completed, as shown in FIG. 4b, the capacitor Cv operates as if it is in the open state, and current does not flow due to the resistance R12 such that the switching element SW7 is turned off.

Figure 3C:
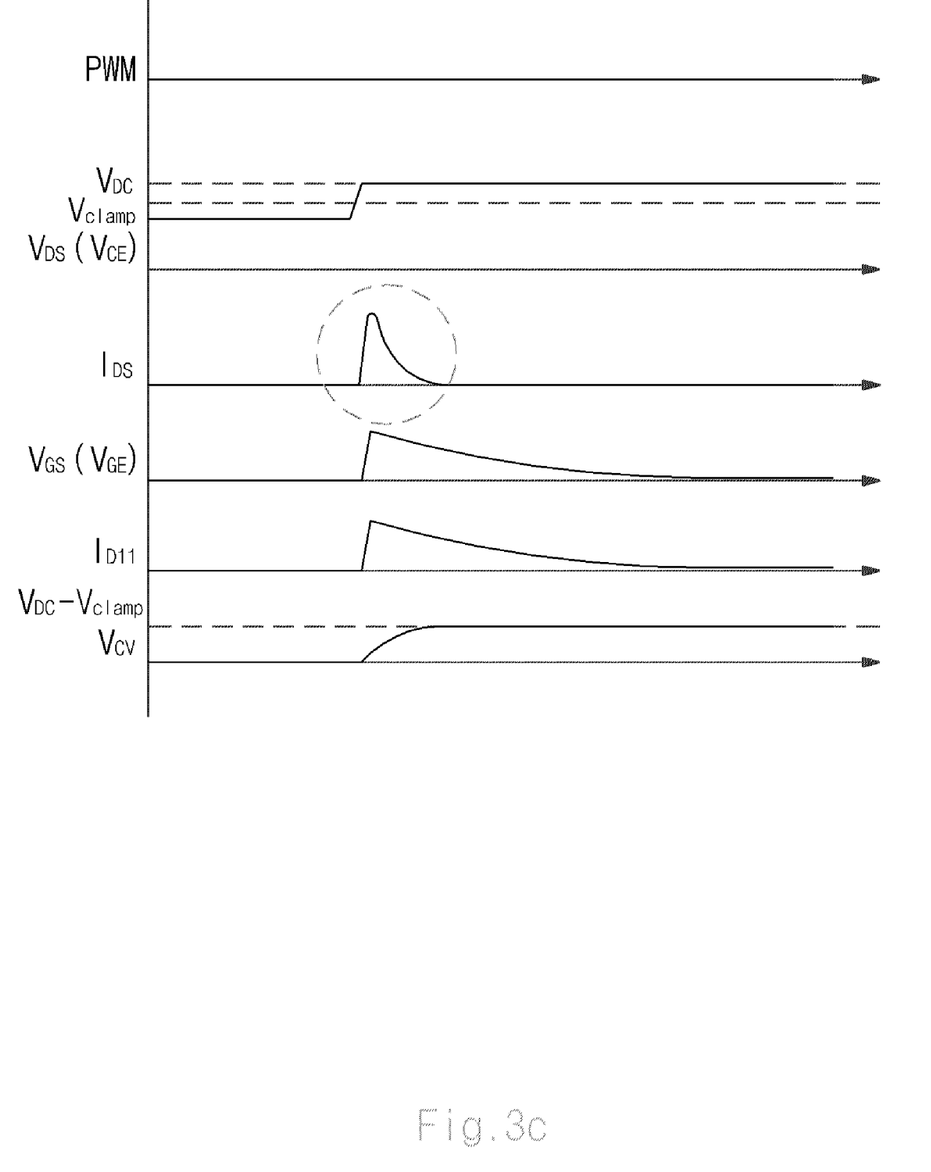

In the meantime, as shown in FIG. 3c, in case the counter electro-motive force of the motor is generated in the steady-state not in the excess state, and the system voltage $V_{DC}$ becomes higher than the clamping voltage $V_{clamp}$, the controller 400 stops the PWM signal outputting of the driving unit 300.

Thereafter, while the clamping diode D11 is turned on and current $I_{D11}$ flows and is charged in the capacitor Cv, the switching element SW7 is turned on during the charge of the capacitor Cv. If the charge of the capacitor Cv is completed, the charged capacitor Cv, as shown in FIG. 4b, operates as if it is the open state, so that current does not flow any more due to the resistance R12 having a large resistance. Accordingly, as shown in FIG. 3b, the current $I_{D11}$ does not flow and the voltage $V_{GS}$ is decreased such that the switching element SW7 is turned off.

As described above, since the switching element SW7 is turned off when the capacitor CV is charged, as shown in FIG. 3c, current $I_{DS}$ is reduced after flowing and current $I_{D11}$ and voltage $V_{GS}$ are also reduced while the capacitor voltage $V_{CV}$ is charged and maintained with a voltage level which is the value obtained by subtracting the clamping voltage $V_{clamp}$ out of the system voltage $V_{DC}$. Although not shown in FIG. 3c, if the motor counter electromotive-force is decreased, that is, if the system voltage level is decreased, the capacitor Cv begins to discharge through R12.

As described above, the inverter circuit can prevent the damage of the switching element SW7.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An inverter circuit for a vehicle, comprising:
   a switching unit that includes a plurality of switching elements and switches a direct current into an alternating current; and
   a variable clamping unit including a clamping unit which turns the plurality of switching elements on to clamp an overshoot, and a variable admittance which turns the switching unit off when a system voltage input to the switching unit is greater than a clamping breakdown voltage,
   wherein the variable admittance includes the capacitor that is charged by current which flows from the clamping unit, and the resistance that is connected in parallel with the capacitor.

2. The inverter circuit of claim 1, wherein the variable admittance turns the plurality of switching elements off when the charge of capacitor is completed.

3. The inverter circuit of claim 1, wherein the clamping unit includes a clamping diode that is turned on in case the overshoot is generated or the system voltage is higher than the clamping breakdown voltage.

4. The inverter circuit of claim 3, wherein the clamping unit further comprises a reverse-current prevention diode which prevents current from flowing from the variable admittance to the clamping diode.

5. The inverter circuit of claim 3, wherein the clamping diode is a Zener diode.

6. The inverter circuit of claim 1, wherein the variable admittance is charged by the clamping unit, and turns the plurality of switching elements on during the charging.

7. The inverter circuit of claim 1, wherein the switching unit is an IGBT (Insulated Gate Bipolar Transistor) module or a FET (field-effect transistor) module.

8. A vehicle, comprising:
   a switching unit that includes a plurality of switching elements and switches a direct current into an alternating current;
   a variable clamping unit including a clamping unit and a variable admittance; and a motor unit that is operated by an output of the switching unit, wherein the clamping unit turns the plurality of switching elements on to clamp an overshoot, and the variable admittance that turns the switching element off when a system voltage input to the switching unit is greater than a clamping breakdown voltage due to counter electro-motive force of the motor unit.

9. The vehicle of claim 8, wherein the variable admittance turns the switching element off when the charge of capacitor is completed in case the system voltage is greater than the clamping breakdown voltage due to counter electro-motive force of the motor unit.

* * * * *